(12) United States Patent
Lee et al.

(10) Patent No.: US 11,062,750 B2
(45) Date of Patent: Jul. 13, 2021

(54) SEMICONDUCTOR DEVICES AND SEMICONDUCTOR SYSTEMS

(71) Applicant: SK hynix Inc., Icheon-si (KR)

(72) Inventors: Yoo Jong Lee, Suwon-si (KR); Kang Sub Kwak, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/905,190

(22) Filed: Jun. 18, 2020

(65) Prior Publication Data

US 2021/0174853 A1 Jun. 10, 2021

(30) Foreign Application Priority Data

Dec. 4, 2019 (KR) .................. 10-2019-0160236

(51) Int. Cl.
  *G11C 8/18* (2006.01)
  *G11C 7/22* (2006.01)
  *H03K 19/20* (2006.01)

(52) U.S. Cl.
  CPC ............ *G11C 8/18* (2013.01); *G11C 7/22* (2013.01); *H03K 19/20* (2013.01)

(58) Field of Classification Search
  CPC .................. G11C 8/18; G11C 7/22

USPC ........................................ 365/233.1
See application file for complete search history.

(56) References Cited

U.S. PATENT DOCUMENTS

| 6,172,537 B1 | 1/2001 | Kanou et al. | |
| 8,687,457 B2* | 4/2014 | Park ................. | G11C 8/18 365/233.1 |
| 2012/0262999 A1* | 10/2012 | Park ................. | G11C 8/18 365/194 |

FOREIGN PATENT DOCUMENTS

KR  1020120117280 A  10/2012

* cited by examiner

*Primary Examiner* — Xiaochun L Chen
(74) *Attorney, Agent, or Firm* — William Park & Associates Ltd.

(57) ABSTRACT

A semiconductor device includes a phase control signal generation circuit, a phase detection circuit, and a selection/transmission circuit. The phase control signal generation circuit outputs one of a command-shifted signal generated from a command/address signal and a clock-shifted signal generated from a clock signal as a phase control signal, based on a leveling enablement signal. The phase detection circuit detects a phase of a leveling clock signal in synchronization with the phase control signal to generate a detection signal. The selection/transmission circuit outputs the detection signal as one of a phase detection signal and a phase adjustment signal based on the leveling enablement signal.

27 Claims, 11 Drawing Sheets

| MODE | CLK | CS | CA<1> | CA<2> | CA<3> | CA<4> | CA<5> | CA<6> | CA<7> |
|---|---|---|---|---|---|---|---|---|---|
| FIRST MODE | Rising | H | L | L | H | H | H or L | H or L | H or L |
| SECOND MODE | Rising | H | L | L | L | H | H | L | H |

FIG. 11

SEMICONDUCTOR DEVICES AND SEMICONDUCTOR SYSTEMS

CROSS-REFERENCE TO RELATED APPLICATIONS

The present application claims priority under 35 U.S.C 119(a) to Korean Application No. 10-2019-0160236, filed on Dec. 4, 2019, which is incorporated herein by reference in its entirety.

BACKGROUND

1. Technical Field

Embodiments of the present disclosure relate to semiconductor devices performing operations for sensing and controlling a frequency of a clock signal and semiconductor systems including the semiconductor devices.

2. Related Art

Semiconductor devices may receive and output the data using a plurality of division clock signals generated by dividing a frequency of a clock signal for fast operation. Thus, the semiconductor devices may perform an operation for compensating for a phase difference between the clock signal and the division clock signal during a write operation and a read operation.

In general, the operation for compensating for a phase difference between the clock signal and the division clock signal may be performed by sensing a logic level of the clock signal at a rising edge of the division clock signal. That is, if the operation for compensating for a phase difference between the clock signal and the division clock signal is activated, the semiconductor device may compare a phase of the division clock signal with a phase of the clock signal to feedback the phase comparison result to an external controller. The external controller may adjust a phase of the division clock signal based on the phase comparison result received from the semiconductor device. An operation for adjusting a phase of the division clock signal may be performed by an operation for adjusting a delay time of the external controller or an operation for controlling a point in time when a level transition of the division clock signal occurs.

SUMMARY

According to an embodiment, a semiconductor device may include a phase control signal generation circuit, a phase detection circuit, and a selection/transmission circuit. The phase control signal generation circuit may be configured to output one of a command-shifted signal generated from a command/address signal and a clock-shifted signal generated from a clock signal as a phase control signal, based on a leveling enablement signal. The phase detection circuit may be configured to detect a phase of a leveling clock signal in synchronization with the phase control signal to generate a detection signal. The selection/transmission circuit may be configured to output the detection signal as one of a phase detection signal and a phase adjustment signal based on the leveling enablement signal.

According to another embodiment, a semiconductor system includes a first semiconductor device and a second semiconductor device. The first semiconductor device may be configured to output a chip selection signal, a command/address signal, a clock signal, and a leveling clock signal, is configured to detect a phase of the leveling clock signal using a phase detection signal, and is configured to adjust a delay time for delaying the leveling clock signal using a phase adjustment signal. The second semiconductor device may be configured to operate in a first mode or a second mode based on the chip selection signal and the command/address signal, may be configured to generate the phase detection signal by detecting a phase difference between the leveling clock signal and the command-shifted signal generated from the command/address signal in the first mode, and may be configured to generate the phase adjustment signal by detecting a phase difference between the leveling clock signal and the clock-shifted signal generated from the clock signal in the second mode.

DETAILED DESCRIPTION

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter with reference to the accompanying drawings. However, the embodiments described herein are for illustrative purposes only and are not intended to limit the scope of the present disclosure.

Figure 1:
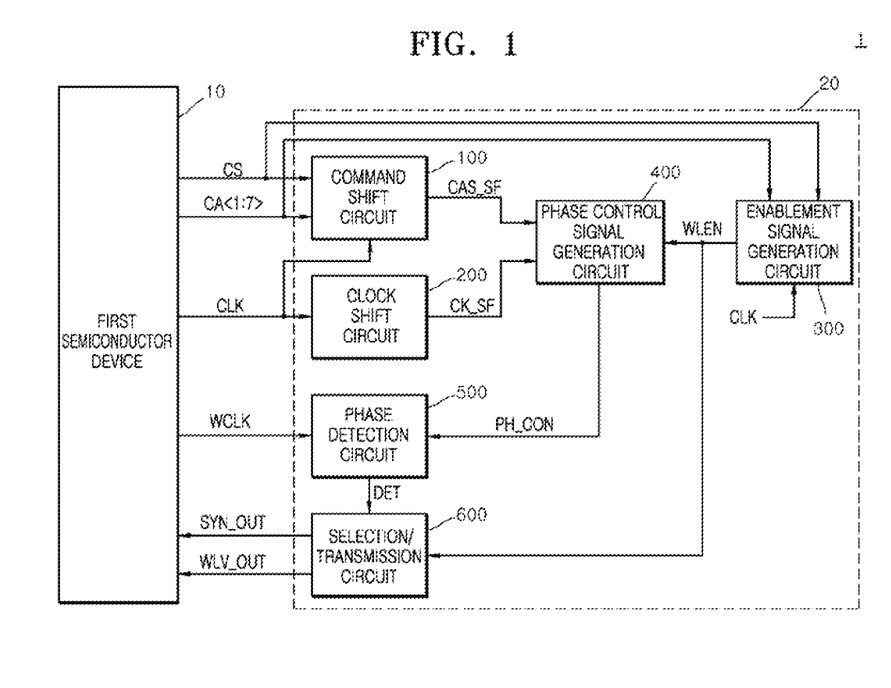
FIG. 1 is a block diagram illustrating a configuration of a semiconductor system according to an embodiment of the present disclosure.

As illustrated in FIG. 1, a semiconductor system 1 may include a first semiconductor device 10 and a second semiconductor device 20.

The first semiconductor device 10 may output a chip selection signal CS and first to seventh command/address signals CA<1:7>. The first semiconductor device 10 may output the chip selection signal CS and the first to seventh command/address signals CA<1:7> having a first logic level combination to activate a first mode. The first semiconductor device 10 may output the chip selection signal CS and the first to seventh command/address signals CA<1:7> having a second logic level combination to activate a second mode. The first semiconductor device 10 may output a clock signal CLK that periodically toggles. The first semiconductor device 10 may output a leveling clock signal WCLK that periodically toggles.

The first semiconductor device 10 may detect a phase of the leveling clock signal WCLK using a phase detection signal SYN_OUT. The first semiconductor device 10 may judge that the clock signal CLK and the leveling clock signal WCLK have the same phase when the phase detection signal SYN_OUT is enabled. The first semiconductor device 10 may judge that the clock signal CLK and the leveling clock signal WCLK have different phases when the phase detection signal SYN_OUT is disabled. The phase detection signal SYN_OUT may be set as a signal for discriminating whether a phase difference between the clock signal CLK and the leveling clock signal WCLK is within a predetermined range. The phase detection signal SYN_OUT may be enabled when a phase difference between the clock signal CLK and the leveling clock signal WCLK is within a predetermined range.

The first semiconductor device 10 may adjust a delay time for delaying the leveling clock signal WCLK using a phase adjustment signal WLV_OUT. When the phase adjustment signal WLV_OUT is enabled, the first semiconductor device 10 may fix the delay time for delaying the leveling clock signal WCLK. When the phase adjustment signal WLV_OUT is disabled, the first semiconductor device 10 may increase the delay time for delaying the leveling clock signal WCLK. The phase adjustment signal WLV_OUT may be set as a signal for compensating for a phase difference between the clock signal CLK and the leveling clock signal WCLK. The phase adjustment signal WLV_OUT may be enabled when a phase difference between the clock signal CLK and the leveling clock signal WCLK is within a predetermined range.

Figure 2:
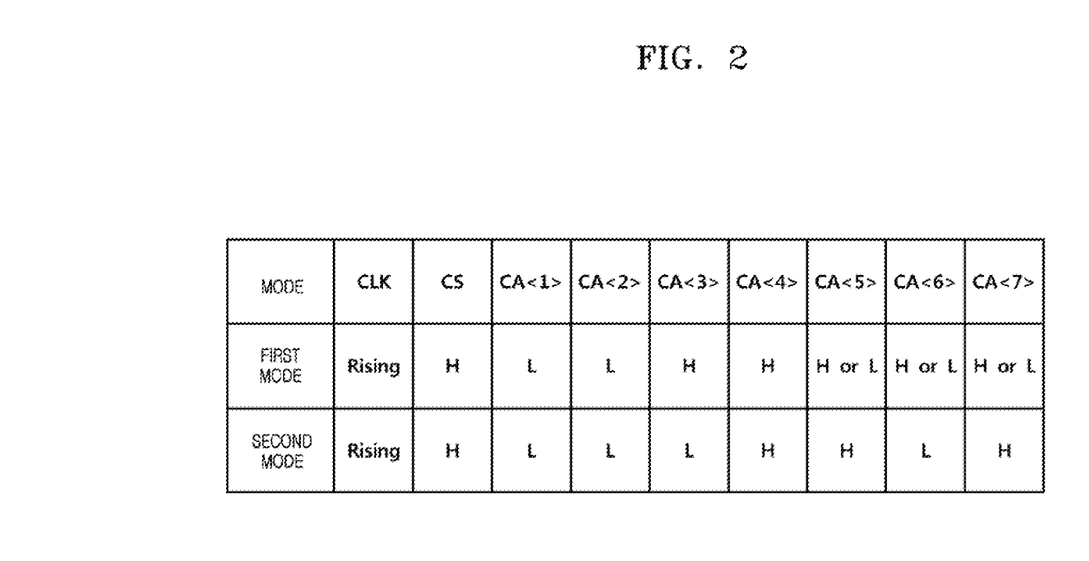
FIG. 2 is a table illustrating logic level combinations of a chip selection signal and a command/address (command and address) signal for activating a first mode and a second mode of a semiconductor system according to an embodiment of the present disclosure.

The first logic level combination of the chip selection signal CS and the first to seventh command/address signals CA<1:7> for activating the first mode will be described with reference to FIG. 2 later. The second logic level combination of the chip selection signal CS and the first to seventh command/address signals CA<1:7> for activating the second mode will be described with reference to FIG. 2 later. The first mode may be set as a mode for a frequency detection operation for detecting a phase difference between the clock signal CLK and the leveling clock signal WCLK. The second mode may be set as a mode for a frequency control operation for compensating for a phase difference between the clock signal CLK and the leveling clock signal WCLK. The leveling clock signal WCLK may be set as a signal having a frequency which is twice a frequency of the clock signal CLK.

The second semiconductor device 20 may include a command shift circuit 100, a clock shift circuit 200, an enablement signal generation circuit 300, a phase control signal generation circuit 400, a phase detection circuit 500, and a selection/transmission circuit 600.

The command shift circuit 100 may generate a command-shifted signal CAS_SF which is enabled in the first mode. The command shift circuit 100 may be synchronized with the clock signal CLK to generate the command-shifted signal CAS_SF according to a logic level combination of the chip selection signal CS and the first to seventh command/address signals CA<1:7>. The command shift circuit 100 may be synchronized with the clock signal CLK to generate the command-shifted signal CAS_SF which is enabled when the chip selection signal CS and the first to seventh command/address signals CA<1:7> have the first logic level combination.

The clock shift circuit 200 may shift the clock signal CLK to generate a clock-shifted signal CK_SF. The clock shift circuit 200 may generate the clock-shifted signal CK_SF which is driven by the clock signal CLK.

The enablement signal generation circuit 300 may generate a leveling enablement signal WLEN which is enabled in the second mode. The enablement signal generation circuit 300 may be synchronized with the clock signal CLK to generate the leveling enablement signal WLEN according to a logic level combination of the chip selection signal CS and the first to seventh command/address signals CA<1:7>. The enablement signal generation circuit 300 may be synchronized with the clock signal CLK to generate the leveling enablement signal WLEN which is enabled when the chip selection signal CS and the first to seventh command/address signals CA<1:7> have the second logic level combination.

The phase control signal generation circuit 400 may output one of the command-shifted signal CAS_SF and the clock-shifted signal CK_SF as a phase control signal PH_CON according to the leveling enablement signal WLEN. The phase control signal generation circuit 400 may output the command-shifted signal CAS_SF as the phase control signal PH_CON when the leveling enablement signal WLEN is disabled. The phase control signal generation circuit 400 may output the clock-shifted signal CK_SF as the phase control signal PH_CON when the leveling enablement signal WLEN is enabled.

The phase detection circuit 500 may detect a phase of the leveling clock signal WCLK in synchronization with the phase control signal PH_CON to generate a detection signal DET. The phase detection circuit 500 may detect a logic level of the leveling clock signal WCLK to generate the detection signal DET while the phase control signal PH_CON is enabled.

The selection/transmission circuit 600 may output the detection signal DET as any one of the phase detection signal SYN_OUT and the phase adjustment signal WLV_OUT according to the leveling enablement signal WLEN. The selection/transmission circuit 600 may output the detection signal DET as the phase detection signal SYN_OUT when the leveling enablement signal WLEN is disabled. The selection/transmission circuit 600 may output the detection signal DET as the phase adjustment signal WLV_OUT when the leveling enablement signal WLEN is enabled.

The second semiconductor device 20 having the aforementioned configuration may operate in the first mode or the second mode according to a logic level combination of the chip selection CS and the first to seventh command/address signals CA<1:7>. The second semiconductor device 20 may generate the phase detection signal SYN_OUT by detecting a phase difference between a phase of the leveling clock signal WCLK and a phase of the command-shifted signal CAS_SF generated from the chip selection signal CS and the first to seventh command/address signals CA<1:7> in the first mode. The second semiconductor device 20 may generate the phase adjustment signal WLV_OUT by detecting a phase difference between a phase of the leveling clock signal WCLK and a phase of the clock-shifted signal CK_SF generated from the clock signal CLK in the second mode.

Logic level combinations of the chip selection signal CS and the first to seventh command/address signals CA<1:7> for activating the first mode and the second mode will be described hereinafter with reference to FIG. 2.

First, a first logic level combination of the chip selection signal CS and the first to seventh command/address signals CA<1:7> for activating the first mode will be described hereinafter.

The first mode may be activated when the chip selection signal CS is enabled to have a logic "high(H)" level, the first command/address signal CA<1> has a logic "low(L)" level, the second command/address signal CA<2> has a logic "low(L)" level, the third command/address signal CA<3> has a logic "high(H)" level, the fourth command/address signal CA<4> has a logic "high(H)" level, and any one of the fifth to seventh command/address signals CA<5:7> has a logic "high(H)" level at a rising edge of the clock signal CLK.

Next, a second logic level combination of the chip selection signal CS and the first to seventh command/address signals CA<1:7> for activating the second mode will be described hereinafter.

The second mode may be activated when the chip selection signal CS is enabled to have a logic "high(H)" level, the first command/address signal CA<1> has a logic "low(L)" level, the second command/address signal CA<2> has a logic "low(L)" level, the third command/address signal CA<3> has a logic "low(L)" level, the fourth command/address signal CA<4> has a logic "high(H)" level, the fifth command/address signal CA<5> has a logic "high(H)" level, the sixth command/address signal CA<6> has a logic "low(L)" level, and the seventh command/address signal CA<7> has a logic "high(H)" level at a rising edge of the clock signal CLK.

Figure 3:
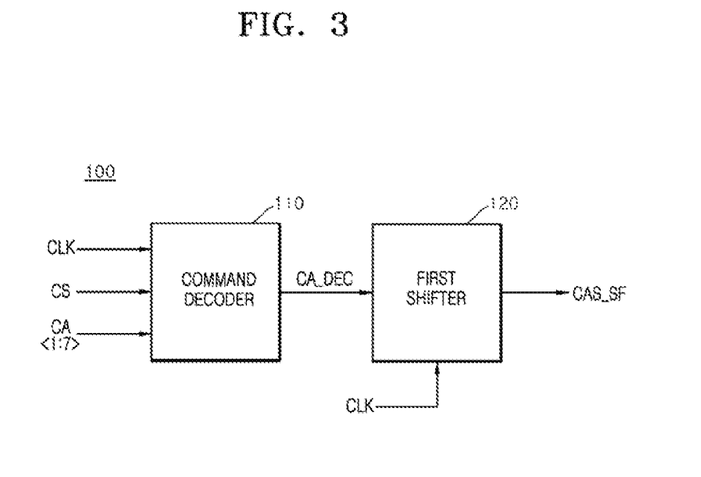
FIG. 3 is a block diagram illustrating a configuration of a command shift circuit included in the semiconductor system of FIG. 1.

Referring to FIG. 3, the command shift circuit 100 may include a command decoder 110 and a first shifter 120.

The command decoder 110 may decode the chip selection signal CS and the first to seventh command/address signals CA<1:7> in synchronization with the clock signal CLK to generate a command-decoded signal CA_DEC. The command decoder 110 may be synchronized with the clock signal CLK to generate the command-decoded signal CA_DEC which is enabled when the chip selection signal CS and the first to seventh command/address signals CA<1:7> have the first logic level combination.

The first shifter 120 may shift the command-decoded signal CA_DEC based on the clock signal CLK to generate the command-shifted signal CAS_SF. The first shifter 120 may be realized using a plurality of flip-flops (not shown) and may shift the command-decoded signal CA_DEC by a period that the clock signal CLK is toggled by a predetermined number of times, thereby generating the command-shifted signal CAS_SF.

Figure 4:
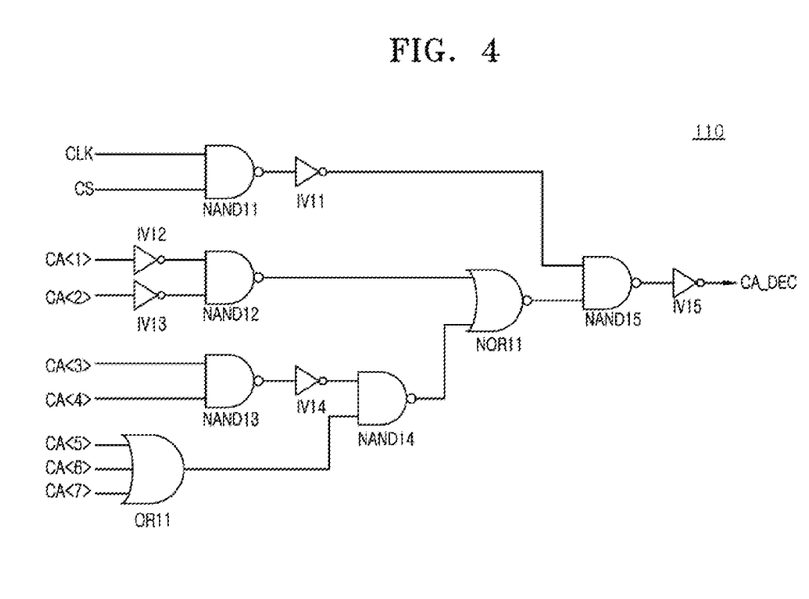
FIG. 4 is a circuit diagram illustrating a configuration of a command decoder included in the command shift circuit of FIG. 3.

Referring to FIG. 4, the command decoder 110 may be realized using logical NAND gates NAND11, NAND12, NAND13, NAND14, and NAND15, inverters IV11, IV12, IV13, IV14, and IV15, a logical OR gate OR11, and a logical NOR gate NOR11.

As described with reference to FIGS. 2 and 3, the command decoder 110 may generate the command-decoded signal CA_DEC which is enabled to have a logic "high" level when the chip selection signal CS is enabled to have a logic "high(H)" level, the first command/address signal CA<1> has a logic "low(L)" level, the second command/address signal CA<2> has a logic "low(L)" level, the third command/address signal CA<3> has a logic "high(H)" level, the fourth command/address signal CA<4> has a logic "high(H)" level, and any one of the fifth to seventh command/address signals CA<5:7> has a logic "high(H)" level while the clock signal CLK has a logic "high" level.

Figure 5:
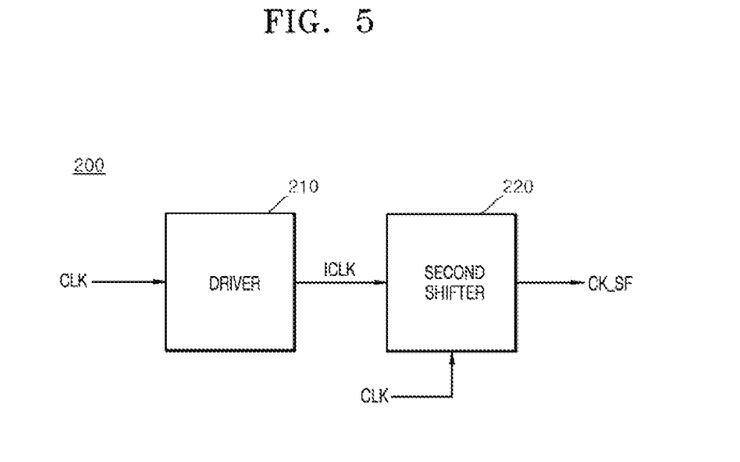
FIG. 5 is a block diagram illustrating a configuration of a clock shift circuit included in the semiconductor system of FIG. 1.

Referring to FIG. 5, the clock shift circuit 200 may include a driver 210 and a second shifter 220.

The driver 210 may generate an internal clock signal ICLK based on a logic level of the clock signal CLK. The driver 210 may generate the internal clock signal ICLK which is driven to have a logic "high" level while the clock signal CLK has a logic "high" level. The driver 210 may generate the internal clock signal ICLK which is driven to have a logic "low" level while the clock signal CLK has a logic "low" level. The driver 210 may generate the internal clock signal ICLK that is toggled to have the same phase as the clock signal CLK.

The second shifter 220 may shift the internal clock signal ICLK based on the clock signal CLK to generate the clock-shifted signal CK_SF. The second shifter 220 may be realized using a plurality of flip-flops (not shown) and may shift the internal clock signal ICLK by a period that the clock signal CLK is toggled by a predetermined number of times, thereby generating the clock-shifted signal CK_SF.

Figure 6:
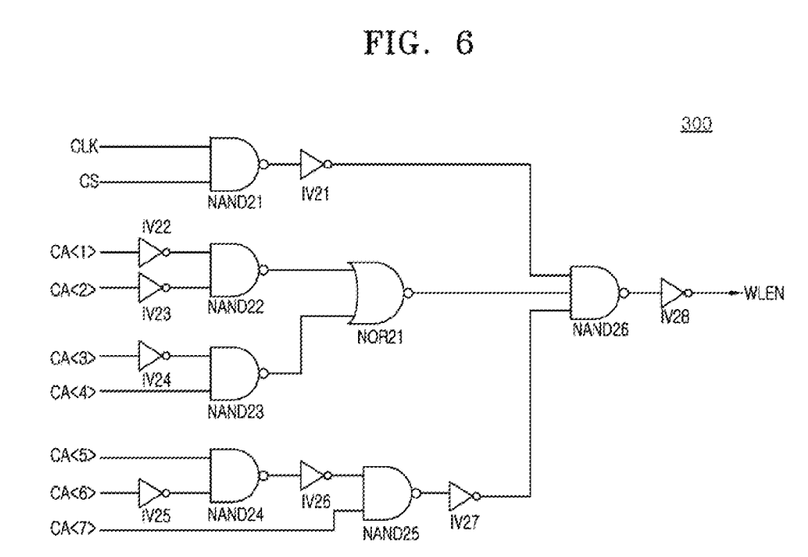
FIG. 6 is a circuit diagram illustrating a configuration of an enablement signal generation circuit included in the semiconductor system of FIG. 1.

Referring to FIG. 6, the enablement signal generation circuit 300 may be realized using logical NAND gates NAND21, NAND22, NAND23, NAND24, NAND25, and NAND26, inverters IV21, IV22, IV23, IV24, IV25, IV26, IV27, and IV28, and a logical NOR gate NOR21.

As described with reference to FIG. 2, the enablement signal generation circuit 300 may generate the leveling enablement signal WLEN which is enabled to have a logic "high" level when the chip selection signal CS is enabled to have a logic "high(H)" level, the first command/address signal CA<1> has a logic "low(L)" level, the second command/address signal CA<2> has a logic "low(L)" level, the third command/address signal CA<3> has a logic "low(L)" level, the fourth command/address signal CA<4> has a logic "high(H)" level, the fifth command/address signal CA<5> has a logic "high(H)" level, the sixth command/address signal CA<6> has a logic "low(L)" level, and the seventh command/address signal CA<7> has a logic "high(H)" level while the clock signal CLK has a logic "high" level.

Figure 7:
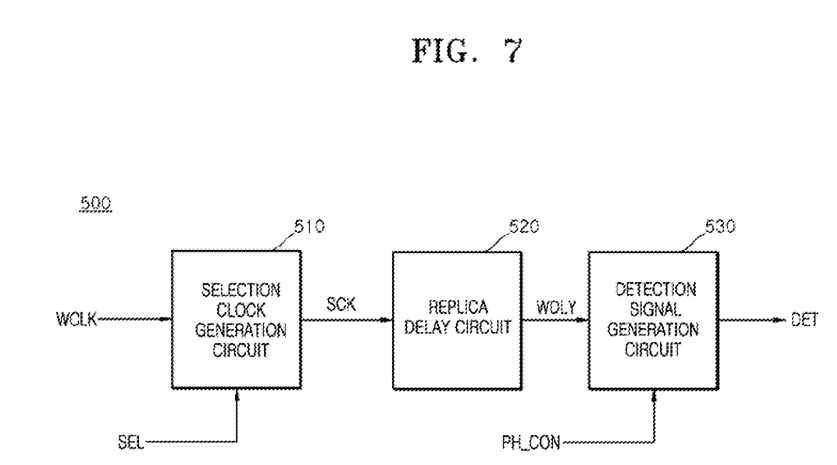
FIG. 7 is a block diagram illustrating a configuration of a phase detection circuit included in the semiconductor system of FIG. 1.

Referring to FIG. 7, the phase detection circuit 500 may include a selection clock generation circuit 510, a replica delay circuit 520, and a detection signal generation circuit 530.

The selection clock generation circuit 510 may divide and delay the leveling clock signal WCLK based on a selection signal SEL to generate a selection clock signal SCK. The selection clock generation circuit 510 may generate the selection clock signal SCK from any one of a first internal division clock signal (DCK<1> of FIG. 8) and a second internal division clock signal (DCK<2> of FIG. 8), which are generated by dividing a frequency of the leveling clock signal WCLK, based on a selection signal SEL.

The replica delay circuit 520 may delay the selection clock signal SCK to generate a delay clock signal WDLY. A delay time of the replica delay circuit 520 may be set to be equal to a sum of delay times of the first shifter 120 of FIG. 3, the driver 210 of FIG. 5, and the second shifter 220 of FIG. 5.

The detection signal generation circuit 530 may detect a phase of the delay clock signal WDLY in synchronization with the phase control signal PH_CON to generate the detection signal DET. The detection signal generation circuit 530 may detect a phase of the delay clock signal WDLY to generate the detection signal DET while the phase control signal PH_CON inputted to the detection signal generation circuit 530 has a logic "high" level. The detection signal generation circuit 530 may latch the delay clock signal WDLY to output the latched signal of the delay clock signal WDLY as the detection signal DET while the phase control signal PH_CON inputted to the detection signal generation circuit 530 has a logic "high" level. The detection signal generation circuit 530 may be realized using a flip-flop that latches the delay clock signal WDLY in synchronization with the phase control signal PH_CON to generate the detection signal DET.

Figure 8:
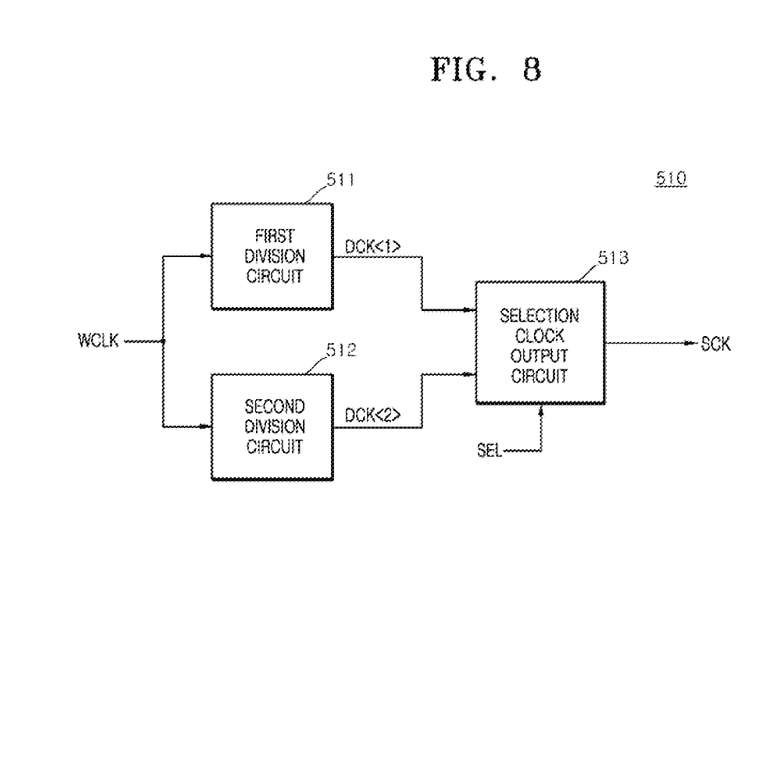
FIG. 8 is a block diagram illustrating a configuration of a selection clock generation circuit included in the phase detection circuit of FIG. 7.

Referring to FIG. 8, the selection clock generation circuit 510 may include a first division circuit 511, a second division circuit 512, and a selection clock output circuit 513.

The first division circuit 511 may divide a frequency of the leveling clock signal WCLK and may delay the divided signal of the leveling clock signal WCLK by a first delay time to generate the first internal division clock signal DCK<1>. The first division circuit 511 may divide a frequency of the leveling clock signal WCLK to generate the first internal division clock signal DCK<1> having a frequency which is half of a frequency of the leveling clock signal WCLK. The first delay time may be set as a delay time for synchronizing a rising edge of the first internal division clock signal DCK<1> with the leveling clock signal WCLK.

The second division circuit 512 may divide a frequency of the leveling clock signal WCLK and may delay the divided signal of the leveling clock signal WCLK by a second delay time to generate the second internal division clock signal DCK<2>. The second division circuit 512 may divide a frequency of the leveling clock signal WCLK to generate the second internal division clock signal DCK<2> having a frequency which is half of a frequency of the leveling clock signal WCLK. The second delay time may be set such that a phase difference between the first internal division clock signal DCK<1> and the second internal division clock signal DCK<2> is 90 degrees. The phase difference of 90 degrees means one fourth of a cycle of the first internal division clock signal DCK<1>. The second delay time may be set to be greater than the first delay time.

The selection clock output circuit 513 may output any one of the first internal division clock signal DCK<1> and the second internal division clock signal DCK<2> as the selection clock signal SCK based on the selection signal SEL. The selection clock output circuit 513 may output the first internal division clock signal DCK<1> as the selection clock signal SCK when the selection signal SEL is enabled. The selection clock output circuit 513 may output the second internal division clock signal DCK<2> as the selection clock signal SCK when the selection signal SEL is disabled. The selection signal SEL may be set as a signal for selecting one of the first internal division clock signal DCK<1> and the second internal division clock signal DCK<2> and may be set to be enabled or disabled according an internal operation of the semiconductor system 1.

Meanwhile, although the selection clock generation circuit 510 illustrated in FIG. 8 is realized to include the first and second division circuits 511 and 512, the number of division circuits included in the selection clock generation circuit 510 may be set to be different according to the embodiments to provide three or more internal division clock signals having different phases.

Figure 9:
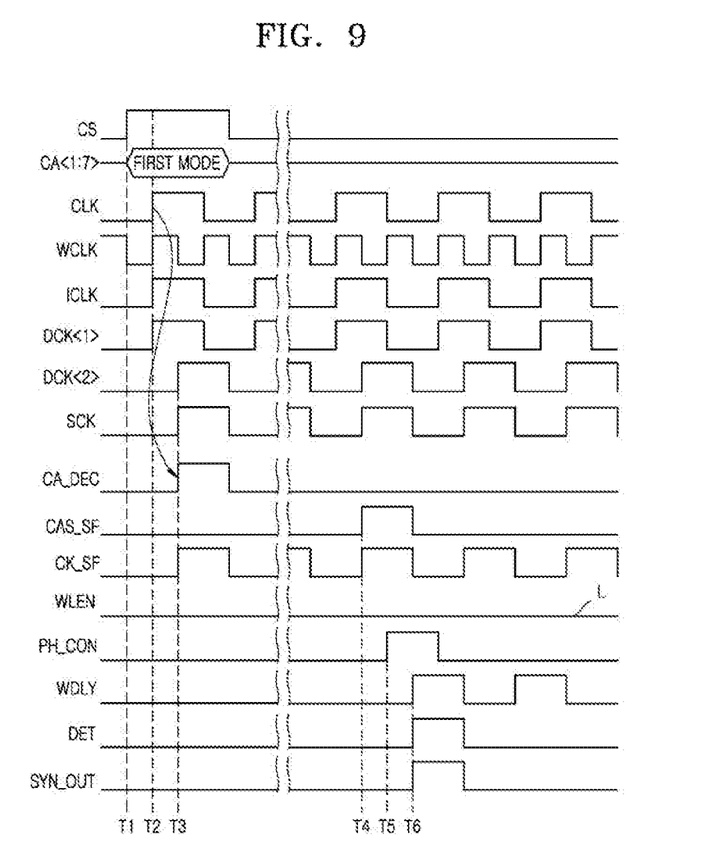
FIGS. 9 and 10 are timing diagrams illustrating operations performed in a first mode and a second mode of a semiconductor system according to an embodiment of the present disclosure.

An operation performed in the first mode that the semiconductor system 1 detects a phase difference between the clock signal CLK and the leveling clock signal WCLK will be described hereinafter with reference to FIG. 9.

At a point in time "T1", the first semiconductor device 10 may output the chip selection signal CS and the first to seventh command/address signals CA<1:7> having the first logic level combination for activating the first mode. The first semiconductor device 10 may output the clock signal CLK that is periodically toggled. The first semiconductor device 10 may output the leveling clock signal WCLK that is periodically toggled.

At a point in time "T2", the driver 210 of the clock shift circuit 200 may generate the internal clock signal ICLK which is driven according to a logic level of the clock signal CLK.

The first division circuit 511 of the selection clock generation circuit 510 may divide a frequency of the leveling clock signal WCLK and may delay the divided signal of the leveling clock signal WCLK by the first delay time to generate the first internal division clock signal DCK<1>.

At a point in time "T3", the command decoder 110 of the command shift circuit 100 may be synchronized with a rising edge of the clock signal CLK created at the point in time "T2" to generate the command-decoded signal CA_DEC which is enabled to have a logic "high" level by the chip selection signal CS and the first to seventh command/address signals CA<1:7> having the first logic level combination.

The clock shift circuit 200 may shift the clock signal CLK created at the point in time "T2" to generate the clock-shifted signal CK_SF.

The enablement signal generation circuit 300 may be synchronized with the clock signal CLK created at the point in time "T2" to generate the leveling enablement signal WLEN which is disabled to have a logic "low" level because the chip selection signal CS and the first to seventh command/address signals CA<1:7> have the first logic level combination.

The second division circuit 512 of the selection clock generation circuit 510 may divide a frequency of the leveling clock signal WCLK and may delay the divided signal of the leveling clock signal WCLK by the second delay time to generate the second internal division clock signal DCK<2>.

The selection clock output circuit 513 of the selection clock generation circuit 510 may output the second internal division clock signal DCK<2> as the selection clock signal SCK based on the selection signal SEL.

At a point in time "T4", the first shifter 120 of the command shift circuit 100 may shift the command-decoded signal CA_DEC created at the point in time "T3" by the clock signal CLK to generate the command-shifted signal CAS_SF having a logic "high" level.

At a point in time "T5", the phase control signal generation circuit 400 may output the command-shifted signal CAS_SF created at the point in time "T4" as the phase control signal PH_CON based on the leveling enablement signal WLEN having a logic "low" level.

At a point in time "T6", the replica delay circuit 520 may delay the selection clock signal SCK created at the point in time "T3" to generate the delay clock signal WDLY. A delay time of the replica delay circuit 520 may be set to be equal to a sum (i.e., a period from the point in time "T3" until the point in time "T5") of delay times of the first shifter 120, the driver 210, and the second shifter 220.

The detection signal generation circuit 530 may detect a phase of the delay clock signal WDLY in synchronization with the phase control signal PH_CON having a logic "high" level to generate the detection signal DET having a logic "high" level.

The selection/transmission circuit 600 may output the detection signal DET as the phase detection signal SYN_OUT based on the leveling enablement signal WLEN having a logic "low" level.

The first semiconductor device 10 may detect a phase of the leveling clock signal WCLK based on the phase detection signal SYN_OUT. In such a case, the first semiconductor device 10 may regard a phase difference between the clock CLK and the leveling clock signal WCLK as being within a range of a set period because the phase detection signal SYN_OUT has a logic "high" level. The set period means a period when the clock CLK and the leveling clock signal WCLK have the same phase.

Figure 10:
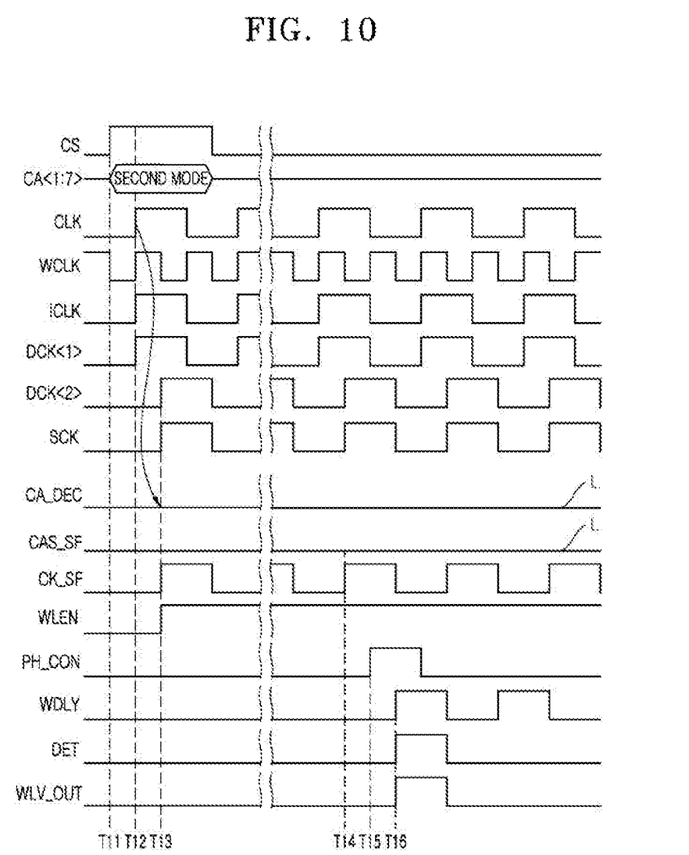

An operation performed in the second mode that the semiconductor system 1 controls a phase difference between the clock signal CLK and the leveling clock signal WCLK will be described hereinafter with reference to FIG. 10.

At a point in time "T11", the first semiconductor device 10 may output the chip selection signal CS and the first to seventh command/address signals CA<1:7> having the second logic level combination for activating the second mode. The first semiconductor device 10 may output the clock signal CLK that is periodically toggled. The first semiconductor device 10 may output the leveling clock signal WCLK that is periodically toggled.

At a point in time "T12", the driver 210 of the clock shift circuit 200 may generate the internal clock signal ICLK which is driven according to a logic level of the clock signal CLK.

The first division circuit 511 of the selection clock generation circuit 510 may divide a frequency of the leveling clock signal WCLK and may delay the divided signal of the leveling clock signal WCLK by the first delay time to generate the first internal division clock signal DCK<1>.

At a point in time "T13", the command decoder 110 of the command shift circuit 100 may be synchronized with a rising edge of the clock signal CLK created at the point in time "T12" to generate the command-decoded signal CA_DEC which is disabled to have a logic "low" level by the chip selection signal CS and the first to seventh command/address signals CA<1:7> having the second logic level combination.

The clock shift circuit 200 may shift the clock signal CLK created at the point in time "T12" to generate the clock-shifted signal CK_SF.

The enablement signal generation circuit 300 may be synchronized with the clock signal CLK created at the point in time "T12" to generate the leveling enablement signal WLEN which is enabled to have a logic "high" level because the chip selection signal CS and the first to seventh command/address signals CA<1:7> have the second logic level combination.

The second division circuit 512 of the selection clock generation circuit 510 may divide a frequency of the leveling clock signal WCLK and may delay the divided signal of the leveling clock signal WCLK by the second delay time to generate the second internal division clock signal DCK<2>.

The selection clock output circuit 513 of the selection clock generation circuit 510 may output the second internal division clock signal DCK<2> as the selection clock signal SCK based on the selection signal SEL.

At a point in time "T14", the first shifter 120 of the command shift circuit 100 may shift the command-decoded signal CA_DEC created at the point in time "T13" by the clock signal CLK to generate the command-shifted signal CAS_SF having a logic "low" level.

At a point in time "T15", the phase control signal generation circuit 400 may output the clock-shifted signal CK_SF created at the point in time "T14" as the phase control signal PH_CON based on the leveling enablement signal WLEN having a logic "high" level.

At a point in time "T16", the replica delay circuit 520 may delay the selection clock signal SCK created at the point in time "T13" to generate the delay clock signal WDLY. A delay time of the replica delay circuit 520 may be set to be equal to a sum (i.e., a period from the point in time "T13" until the point in time "T15") of delay times of the first shifter 120, the driver 210, and the second shifter 220.

The detection signal generation circuit 530 may detect a phase of the delay clock signal WDLY in synchronization with the phase control signal PH_CON having a logic "high" level to generate the detection signal DET having a logic "high" level.

The selection/transmission circuit 600 may output the detection signal DET as the phase adjustment signal WLV_OUT based on the leveling enablement signal WLEN having a logic "high" level.

The first semiconductor device 10 may control a delay time of the leveling clock signal WCLK based on the phase adjustment signal WLV_OUT. In such a case, the first semiconductor device 10 may fix a delay time of the leveling clock signal WCLK because the phase adjustment signal WLV_OUT has a logic "high" level.

Meanwhile, when the phase adjustment signal WLV_OUT is disabled to have a logic "low" level, the first semiconductor device 10 may increase a delay time of the leveling clock signal WCLK until a point in time when the phase adjustment signal WLV_OUT is enabled to have a logic "high" level to compensate for a phase difference between the clock signal CLK and the leveling clock signal WCLK.

The semiconductor system 1 having the aforementioned configurations may perform an operation for detecting a frequency difference between the clock signal CLK and the leveling clock signal WCLK and an operation for adjusting a frequency difference between the clock signal CLK and the leveling clock signal WCLK based on the command/address signals CA<1:7>. In addition, the semiconductor system 1 may perform the frequency detection operation and the frequency control operation between the clock signal CLK and the leveling clock signal WCLK using the single replica delay circuit 520, thereby reducing a layout area of the semiconductor system 1.

Figure 11:
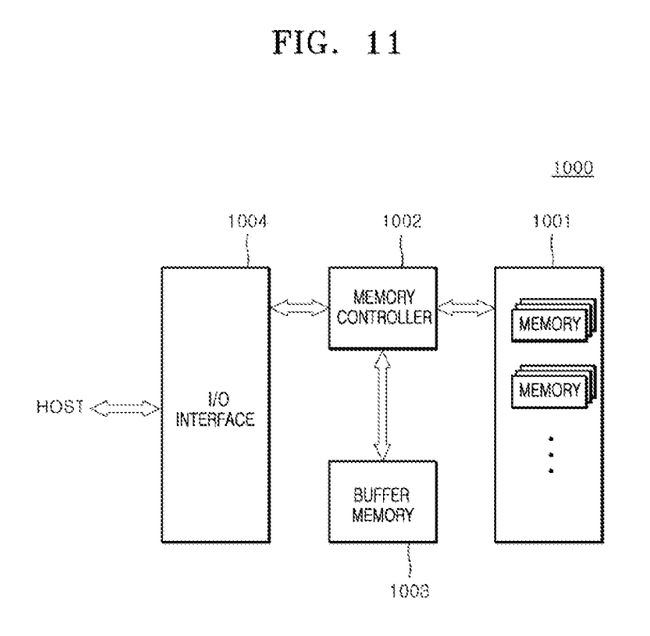
FIG. 11 is a block diagram illustrating a configuration of an electronic system including the semiconductor system shown in FIGS. 1 to 10.

The semiconductor system 1 described with reference to FIG. 1 may be applied to an electronic system that includes a memory system, a graphic system, a computing system, a mobile system, or the like. For example, as illustrated in FIG. 11, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include the second semiconductor devices 20 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 10 illustrated in FIG. 1. Although FIG. 12 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
    a phase control signal generation circuit configured to output one of a command-shifted signal generated from a command/address (command and address) signal and a clock-shifted signal generated from a clock signal as a phase control signal, based on a leveling enablement signal;
    a phase detection circuit configured to detect a phase of a leveling clock signal in synchronization with the phase control signal to generate a detection signal; and
    a selection/transmission (selection and transmission) circuit configured to output the detection signal as one of a phase detection signal and a phase adjustment signal based on the leveling enablement signal.

2. The semiconductor device of claim 1, wherein the leveling clock signal has a frequency which is twice a frequency of the clock signal.

3. The semiconductor device of claim 1, wherein when the leveling enablement signal is enabled the phase control signal generation circuit outputs the clock-shifted signal as the phase control signal to compensate for a phase difference between the clock signal and the leveling clock signal.

4. The semiconductor device of claim 1, wherein when the leveling enablement signal is disabled the phase control signal generation circuit outputs the command-shifted signal as the phase control signal to detect for a phase difference between the clock signal and the leveling clock signal.

5. The semiconductor device of claim 1,
    wherein when the leveling enablement signal is enabled the selection/transmission circuit outputs the detection signal as the phase adjustment signal to perform a frequency control operation for controlling a phase difference between the clock signal and the leveling clock signal, and
    wherein when the leveling enablement signal is disabled the selection/transmission circuit outputs the detection signal as the phase detection signal for indicating a phase difference between the clock signal and the leveling clock signal.

6. The semiconductor device of claim 5,
    wherein when the detection signal is enabled a delay time of the leveling clock signal is fixed, and wherein when the detection signal is disabled the delay time of the leveling clock signal is increased.

7. The semiconductor device of claim 5,
wherein when the detection signal is enabled the phase detection signal indicates that the phase difference between the clock signal and the leveling clock signal is within a predetermined range, and
wherein when the detection signal is enabled the phase detection signal indicates that the phase difference between the clock signal and the leveling clock signal is not within the predetermined range.

8. The semiconductor device of claim 1, wherein the leveling enablement signal is enabled in a mode for controlling a phase difference between the clock signal and the leveling clock signal.

9. The semiconductor device of claim 1, wherein the phase detection signal and the phase adjustment signal are enabled when a phase difference between the clock signal and the leveling clock signal is within a range of a set period.

10. The semiconductor device of claim 1,
wherein the phase detection signal is a signal for discriminating whether a phase difference between the clock signal and the leveling clock signal is within a range of a set period; and
wherein the phase adjustment signal is a signal for compensating for a phase difference between the clock signal and the leveling clock signal.

11. The semiconductor device of claim 1, wherein the phase detection circuit includes:
a selection clock generation circuit configured to divide and delay the leveling clock signal based on a selection signal to generate a selection clock signal;
a replica delay circuit configured to delay the selection clock signal to generate a delay clock signal; and
a detection signal generation circuit configured to detect a phase of the delay clock signal to generate the detection signal during a period that the phase control signal is enabled.

12. The semiconductor device of claim 11, wherein the selection clock generation circuit includes:
a first division circuit configured to divide a frequency of the leveling clock signal and configured to delay the divided leveling clock signal by a first delay time to generate a first internal division clock signal;
a second division circuit configured to divide a frequency of the leveling clock signal and configured to delay the divided leveling clock signal by a second delay time to generate a second internal division clock signal; and
a selection clock output circuit configured to output one of the first internal division clock signal and the second internal division clock signal as the selection clock signal based on the selection signal.

13. The semiconductor device of claim 12,
wherein the second delay time is set to be greater than the first delay time; and
wherein the second delay time is set to be greater than the first delay time by one fourth of a cycle of the first internal division clock signal.

14. The semiconductor device of claim 1, further comprising:
a command shift circuit configured to be synchronized with the clock signal to generate the command-shifted signal which is enabled when a chip selection signal and the command/address signal have a first logic level combination;
a clock shift circuit configured to shift the clock signal to generate the clock-shifted signal; and
an enablement signal generation circuit configured to be synchronized with the clock signal to generate the leveling enablement signal which is enabled when the chip selection signal and the command/address signal have a second logic level combination.

15. The semiconductor device of claim 14, wherein the command shift circuit includes:
a command decoder configured to be synchronized with the clock signal to generate a command-decoded signal which is enabled when the chip selection signal and the command/address signal have the first logic level combination; and
a first shifter configured to shift the command-decoded signal based on the clock signal to generate the command-shifted signal.

16. The semiconductor device of claim 14, wherein the clock shift circuit includes:
a driver configured to generate an internal clock signal which is driven according to a logic level of the clock signal; and
a second shifter configured to shift the internal clock signal based on the clock signal to generate the clock-shifted signal.

17. A semiconductor system comprising:
a first semiconductor device configured to output a chip selection signal, a command/address (command and address) signal, a clock signal, and a leveling clock signal, configured to detect a phase of the leveling clock signal using a phase detection signal, and configured to adjust a delay time for delaying the leveling clock signal using a phase adjustment signal; and
a second semiconductor device configured to operate in one of a first mode and a second mode based on the chip selection signal and the command/address signal, configured to generate the phase detection signal by detecting a phase difference between the leveling clock signal and the command-shifted signal generated from the command/address signal in the first mode, and configured to generate the phase adjustment signal by detecting a phase difference between the leveling clock signal and the clock-shifted signal generated from the clock signal in the second mode.

18. The semiconductor system of claim 17, wherein the leveling clock signal has a frequency which is twice a frequency of the clock signal.

19. The semiconductor system of claim 17, wherein the first semiconductor device is configured to fix a delay time for delaying the leveling clock signal when the phase adjustment signal is enabled and is configured to adjust a delay time for delaying the leveling clock signal when the phase adjustment signal is disabled.

20. The semiconductor system of claim 17, wherein the phase detection signal and the phase adjustment signal are enabled when a phase difference between the clock signal and the leveling clock signal is within a range of a set period.

21. The semiconductor system of claim 17, wherein the second semiconductor device includes:
a phase control signal generation circuit configured to output the command-shifted signal as a phase control signal based on a leveling enablement signal in the first mode and configured to output the clock-shifted signal as the phase control signal based on the leveling enablement signal in the second mode;
a phase detection circuit configured to detect a phase of the leveling clock signal in synchronization with the phase control signal to generate a detection signal; and a selection/transmission (selection and transmission) circuit configured to output the detection signal as one of the phase detection signal and the phase adjustment signal based on the leveling enablement signal.

22. The semiconductor system of claim 21, wherein the phase detection circuit includes:
   a selection clock generation circuit configured to divide and delay the leveling clock signal based on a selection signal to generate a selection clock signal;
   a replica delay circuit configured to delay the selection clock signal to generate a delay clock signal; and
   a detection signal generation circuit configured to detect a phase of the delay clock signal to generate the detection signal during a period that the phase control signal is enabled.

23. The semiconductor system of claim 22, wherein the selection clock generation circuit includes:
   a first division circuit configured to divide a frequency of the leveling clock signal and configured to delay the divided leveling clock signal by a first delay time to generate a first internal division clock signal;
   a second division circuit configured to divide a frequency of the leveling clock signal and configured to delay the divided leveling clock signal by a second delay time to generate a second internal division clock signal; and
   a selection clock output circuit configured to output one of the first internal division clock signal and the second internal division clock signal as the selection clock signal based on the selection signal.

24. The semiconductor system of claim 23,
   wherein the second delay time is set to be greater than the first delay time; and
   wherein the second delay time is set to be greater than the first delay time by one fourth of a cycle of the first internal division clock signal.

25. The semiconductor system of claim 21, further comprising:
   a command shift circuit configured to be synchronized with the clock signal to generate the command-shifted signal which is enabled when the chip selection signal and the command/address signal have a first logic level combination;
   a clock shift circuit configured to shift the clock signal to generate the clock-shifted signal; and
   an enablement signal generation circuit configured to be synchronized with the clock signal to generate the leveling enablement signal which is enabled when the chip selection signal and the command/address signal have a second logic level combination.

26. The semiconductor system of claim 25, wherein the command shift circuit includes:
   a command decoder configured to be synchronized with the clock signal to generate a command-decoded signal which is enabled when the chip selection signal and the command/address signal have the first logic level combination; and
   a first shifter configured to shift the command-decoded signal based on the clock signal to generate the command-shifted signal.

27. The semiconductor system of claim 25, wherein the clock shift circuit includes:
   a driver configured to generate an internal clock signal which is driven according to a logic level of the clock signal; and
   a second shifter configured to shift the internal clock signal based on the clock signal to generate the clock-shifted signal.

* * * * *